(12) United States Patent
Yamamoto (10) Patent No.: US 6,232,178 B1
(45) Date of Patent: May 15, 2001

(54) METHOD FOR MANUFACTURING CAPACITIVE ELEMENT (75) Inventor: Ichiro Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/439,251

(22) Filed: Nov. 12, 1999

(30) Foreign Application Priority Data

Nov. 11, 1998 (JP) .................................................. 10-320583

(51) Int. Cl.⁷ ................................................ H01L 21/8242
(52) U.S. Cl. .......................... 438/255; 438/398; 438/964
(58) Field of Search .................................. 438/253–256, 438/390–399, 964

(56) References Cited

U.S. PATENT DOCUMENTS

| 5,634,974 | * | 6/1997 | Weimer et al. | 117/103 |
| 5,976,931 | * | 11/1999 | Yew et al. | 438/255 |
| 5,989,969 | * | 11/1999 | Watanabe et al. | 438/381 |
| 6,013,555 | * | 1/2000 | Yew et al. | 438/398 |
| 6,027,970 | * | 2/2000 | Sharan et al. | 438/255 |
| 6,100,203 | * | 8/2000 | Kill et al. | 438/745 |

FOREIGN PATENT DOCUMENTS

| 5-343614 | 12/1993 | (JP) . |
| 7-38062 | 2/1995 | (JP) . |
| 9-289292 | 11/1997 | (JP) . |

* cited by examiner

Primary Examiner—Jey Tsai
(74) Attorney, Agent, or Firm—Hutchins, Wheeler & Dittmar

(57) ABSTRACT

A method for forming a capacitive element comprising the steps of: forming hemispherical grains (HSGs) by treating an amorphous silicon film overlying a semiconductor substrate by means of a HSG treatment; conducting an oxidation blocking treatment on the surface of the HSGs; and introducing an impurity on the HSGs to form the capacitive element. The oxidation blocking treatment is preferably a hydrogen termination treatment which effectively prevents formation of a spontaneous oxidation film which may reduce a size of the HSGs to decrease a mechanical strength thereof.

10 Claims, 7 Drawing Sheets

METHOD FOR MANUFACTURING CAPACITIVE ELEMENT

BACKGROUND OF THE INVENTION (a) Field of the Invention

The present invention relates to a method for forming a capacitive element in which a plurality of minute capacitive elements having a large electrostatic capacitance are formed by making a surface of a bottom electrode to have hemispherical grains (HSGs), more in detail to the method for forming the minute capacitive elements having the large electrostatic capacitance by injecting dopants at a high concentration into the HSGs of the bottom electrode.

(b) Description of the Related Art

A semiconductor device such as a DRAM includes a capacitive element such as a stacked capacitor and a trench capacitor as a component for a memory cell circuit. The capacitive element generally includes a bottom electrode, a dielectric film and a top electrode.

When a stacked capacitive element is conventionally manufactured, the bottom electrode is formed by growing a polysilicon film on a dielectric film overlying a semiconductor substrate, introducing impurities such as phosphorus into the polysilicon film and patterning the polysilicon film by a photolithographic and etching technique. Then, after a dielectric film such as an oxide film and a nitride film is formed on the bottom electrode, the top electrode is formed, similarly to the bottom electrode, to provide the capacitive element.

With the development of miniaturization and high integration of the semiconductor device, the capacitive element employed as the component thereof is also required to be miniaturized. Recently, a capacitive element for securing a large electrostatic capacitance by employing a small electrode has been realized by increasing a surface area of a bottom electrode having HSGs.

A configuration of the capacitive element having the bottom electrode composed of HSGs will be described referring to FIGS. 1A and 1B. The structure of FIG. 1B is different from that of FIG. 1A only in that the bottom electrode 11A in FIG. 1B has no HSGs while the bottom electrode 11 in FIG. 1A has HSGs.

Figure 1A:
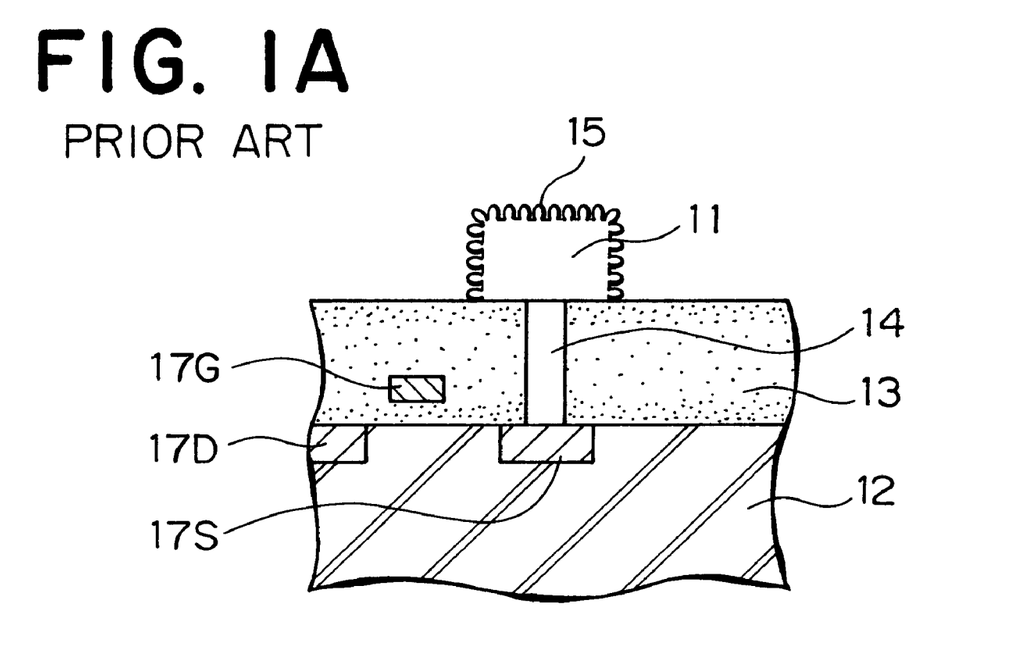
FIGS. 1A and 1B are vertical sectional views showing a conventional first electrode having HSGs and another conventional first electrode having no HSGs, respectively.
Figure 1B:
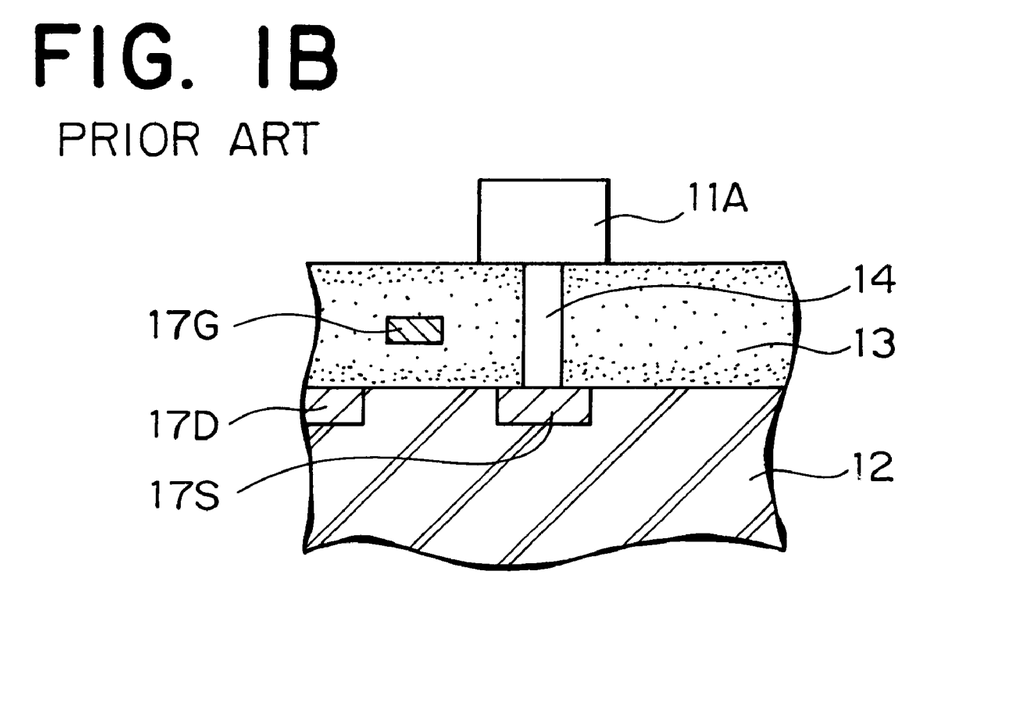

The bottom electrode 11 of the capacitive element is formed on a plug 14 penetrating through an interlayer dielectric film 13 to a silicon substrate 12 as shown in FIG. 1A. The bottom end of the plug 14 is in contact with a region such as a source diffused region 17S formed on the silicon substrate 12. In FIGS. 1A and 1B, numerals 17D and 17G denote a drain diffused layer and a bit line, respectively.

In FIG. 1A, the bottom electrode 11 has on its surface a plenty of HSGs. The respective grains have a mushroom or semispherical convex shape of which a diameter is about between 30 and 70 nm, thereby increasing the surface area of the bottom electrode 11. The surface area of the bottom electrode 11 having the HSG amounts to about twice that of the bottom electrode 11A having no HSGs shown in FIG. 1B.

The bottom electrode having the HSGs is generally is manufactured in accordance with the following process.

A doped amorphous silicon film, for example, a phosphorous (P)-doped amorphous silicon film is formed on a dielectric layer, followed by patterning thereof to form a bottom electrode. Then, the P-doped amorphous silicon film is treated to have the HSGs in accordance with a known process and under known conditions. Then, the bottom electrode having the HSGs is thermally treated at a temperature of 800° C. or more to crystallize the amorphous silicon and to diffuse the phosphorus in the amorphous silicon film into the HSGs to provide the bottom electrode with higher conductivity.

Meanwhile, the thermal treatment temperature of the above capacitive element forming process should be lowered by reasons on structural and circuit designs of the semiconductor device together with the advance of miniaturization and complexity thereof. This is because the components such as transistors mounted together with the capacitive elements on a wafer should be protected from the damage due to exposure to a high temperature during the above thermal treatment For example, in a 1 G-bit DRAM or a DRAM mounted with a logic circuit, when the thermal treatment of the process of forming the capacitive element is conducted at a temperature of 800° C. or more, impurities in source/drain diffused regions diffuse to shorten a gate length, and impurities (for example, boron) in a gate diffuse to change a threshold voltage of the transistor. in addition, if the wafer having a Ti-silicide film or a Co-silicide film on the surface of the source/drain diffused region or the gate electrode is thermally treated, the silicide film is coagulated to increase the electric resistance. As described above, the thermal treatment at the temperature of 800° C. or more lowers the characteristic of the element such as the transistor, and is hardly conducted reluctantly.

However, the lowering of the thermal treatment temperature below 800° C. reduces a diffusion rate of the phosphorus in the P-doped amorphous silicon film to make difficult the diffusion of the phosphorous through a narrow throat, generally formed at the base of the respective HSGs, into the HSGs. Thus, capacitance reduction due to depletion of the dopant in the HSGs may occur due to the lowering of the diffusion rate.

Figure 2A:
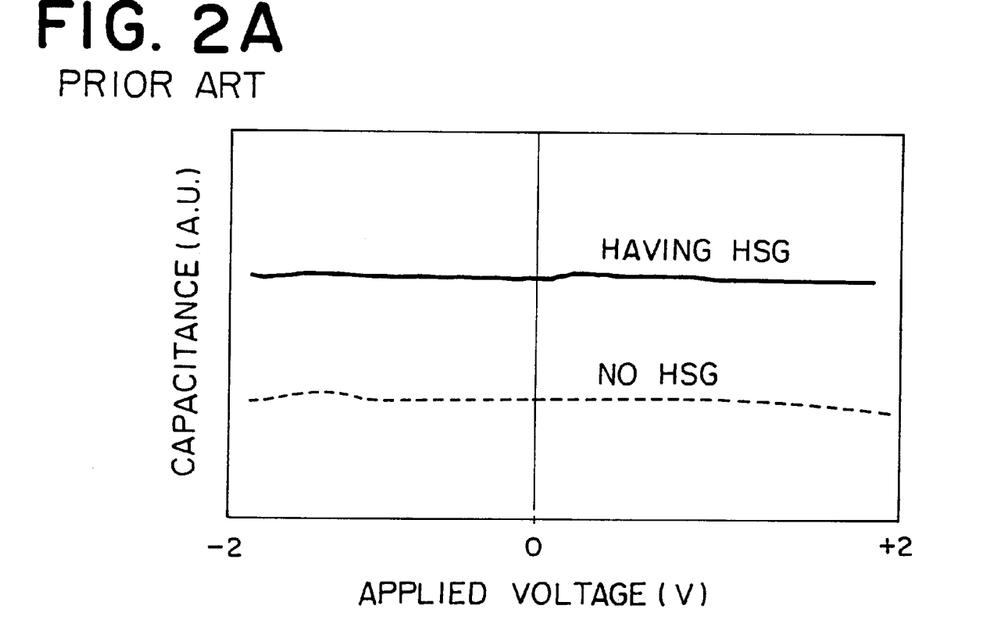
FIGS. 2A and 2B are graphs showing an ideal C-V characteristic of a capacitive element including the conventional first electrode having the HSGs thereon and a C-V characteristic of another conventional first electrode manufactured by a thermal treatment at a lower temperature, respectively.
Figure 2B:
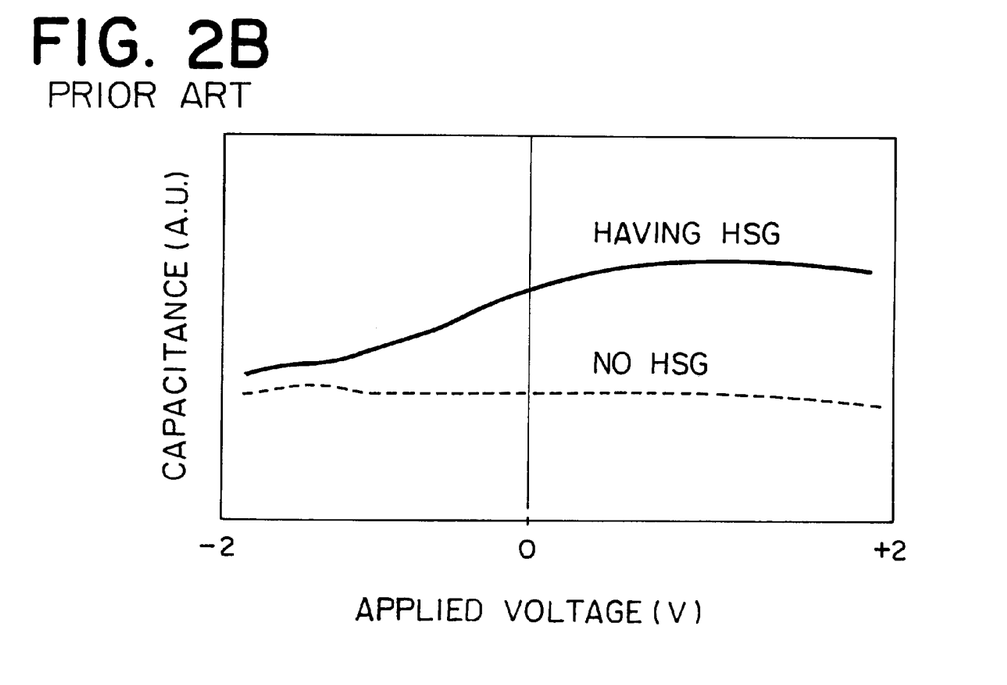

Then, the capacitance reduction due to the depletion of the dopants in the HSGs will be described referring to FIGS. 2A and 2B. FIG. 2A is a graph exemplifying an ideal C-V characteristic of a capacitive element, and FIG. 2B is a graph exemplifying a curent-voltage characteristic obtained by a thermal treatment for 10 minutes at 800° C. lower than a conventional thermal treatment temperature. In the both graphs, the characteristic of the bottom electrode having the HSGs are compared with that having no HSGs.

The comparison of the graphs of FIGS. 2A and 2B indicates that when the thermal treatment temperature after the formation of the HSGs is low, the resultant capacitance significantly reduces due to depleion of the carriers in the HSGs if an applied voltage (V) of a top electrode is lower than the potential of the bottom electrode. In other words, when the applied voltage of the top electrode becomes higher than the potential of the bottom electrode, the capacitance of the N-type bottom electrode slightly increases because electrons are attracted in the bottom electrode, whereas when the applied voltage becomes lower, the electrons in the bottom electrode are expelled to further proceed the depletion of electrons to lower the capacitance.

Figure 3A:
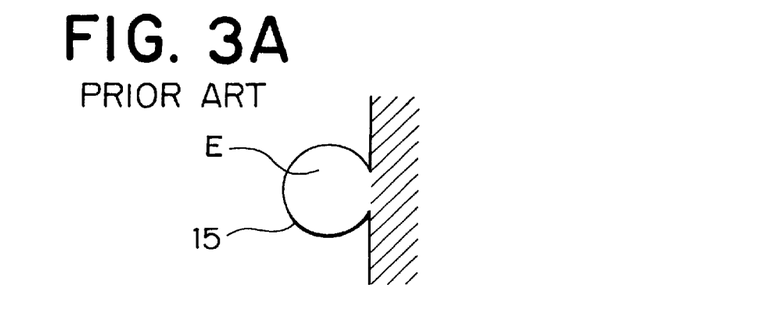
FIGS. 3A, 3B and 3C are schematic vertical sectional views showing a state immediately after making the HSGs, a state after a high temperature thermal treatment, and a state when a thermal treatment is conducted at a lower temperature, respectively.
Figure 3B:
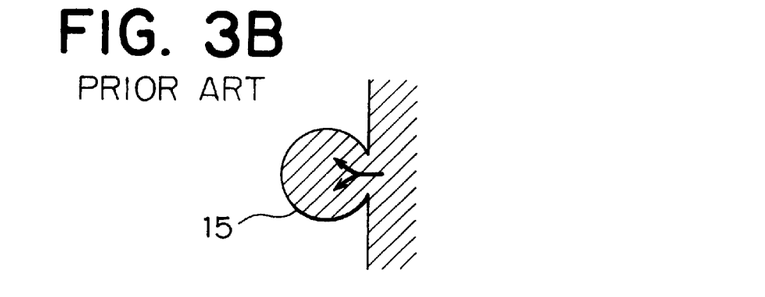
Figure 3C:
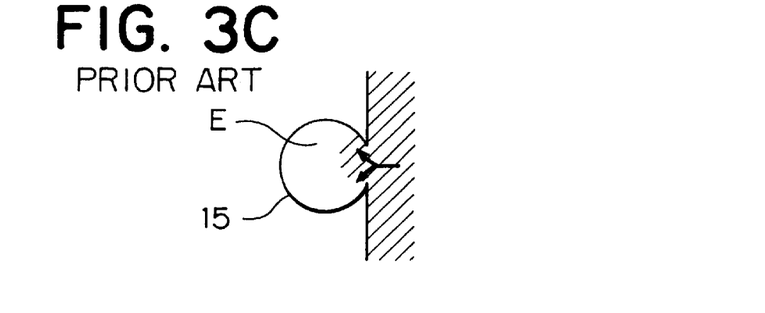

The phenomenon concerning the dopant depletion of the HSGs will be further described referring to FIGS. 3A to 3C in which a dense hatching part indicates a higher concentration region of impurities (phosphorous) whereas a non-hatching part indicates a lower concentration region.

The interior of the HSGs is non-doped immediately after the treatment for forming the HSGs as shown in FIG. 3A, and all the region is a depleted region "E" having substantially no dopant. The succeeding high temperature treatment at 800° C. or more makes the phosphorous sufficiently diffuse from the P-doped amorphous silicon film into the HSGs to extinguish the depleted region "E".

However, if the thermal treatment is below 800° C., the diffusion rate of the phosphorus in the silicon film is reduced to make it difficult for the dopants to diffuse through the narrow throat at the bases of the HSGs 15 into the bodies of the HSGs 15. The insufficient diffusion of the phosphorus into the HSGs 15 keeps a most part of the HSGs 15 as a depleted region.

The existence of the depleted region "E" reduces the capacitance due to the above-described reasons when the applied voltage of the top electrode becomes lower.

A phosphorus solid phase diffusion method by employing $POCl_3$ for suppressing the depletion is described in, for example, JP-A-5(1993)-343614, JP-A-7(1995)-38062 and JP-A-9(1997)-289292.

Figure 4:
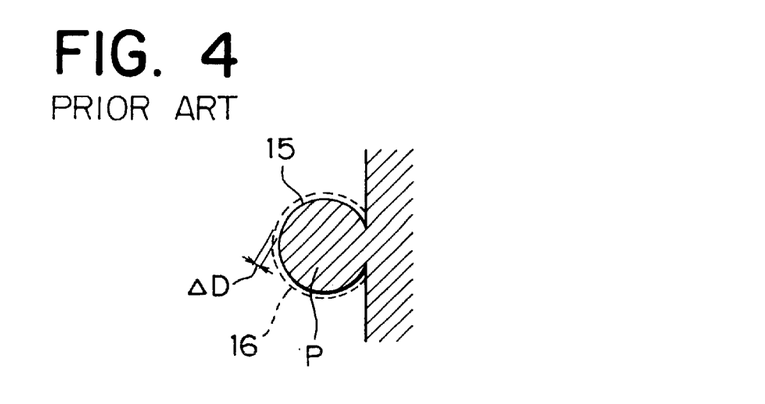
FIG. 4 is a schematic vertical sectional view showing a state of the HSGs doped in accordance with a phosphorus solid phase diffusion process.

The method includes to a thermal treatment of a wafer having HSGs at a temperature below 800° C. in a furnace in which the $POCl_3$ flows. In accordance with the doping of the phosphorus by the solid phase diffusion method, a $SiO_2$ film 16 having a high concentration of phosphorus is formed on the surface of the HSGs as shown in FIG. 4. It is recited in the publications that the phosphorus in the $SiO_2$ film 16 diffuses into the interior of the HSGs 15 to form a diffused region "P" of the phosphorus.

In the conventional method of forming a bottom electrode which includes a doping step in accordance with the above described solid phase diffusion, a PSG (Phospho-Silicate Glass) film is formed as the $SiO_2$ film 16 including the phosphorus by utilizing oxidation of silicon. Since a quality of this type of $SiO_2$ film 16 is poor and a thickness thereof is thick, the film is not suitable for a capacitive dielectric film. Accordingly, the $SiO_2$ film 16 is removed by means of hydrofluoric acid after a thermal treatment.

The removal of the $SiO_2$ film 16 by means of the hydrofluoric acid generates a loss (ΔD) to decrease the particle size of the HSGs to produce the following problems.

A first problem is that the reduction of the surface area of the HSGs hardly increases an electrostatic capacitance as desired.

A second problem is that the HSGs 15 are liable to be dropped by means of reduction of a mechanical strength due to thinning of the base of the HSGs 15 caused by the reduction of the particle size of the HSGs 15.

Therefore, in place of the solid phase diffusion method of the phosphorus, a gas phase diffusion process is attempted in which the bottom electrode having the HSGs is thermally treated at a temperature between 600 and 800° C. in an ambient having a dopant gas which does not react with silicon, for example, in a $AsH_3$ or $PH_3$ ambient. The gas phase diffusion process which does not reduce the HSGs in size uses injection of dopants into the HSGs at a high concentration to prevent the reduction of the capacitance due to the depletion.

However, in the attempted process, lesser variation on qualities of wafers, securing of a stable and high amount of doping, and formation of the minute capacitive element having a large and desired electrostatic capacitance are hardly achieved because of the following reasons.

Figure 5:
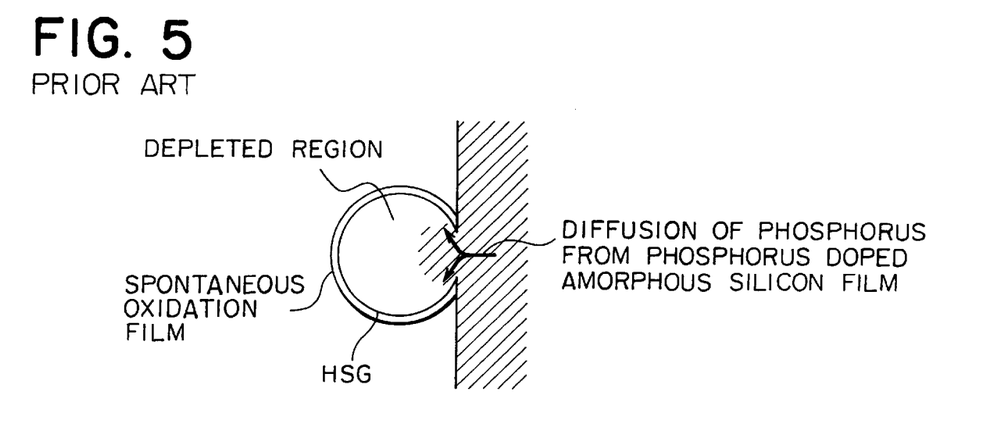
FIG. 5 is a schematic vertical sectional view showing a spontaneous oxidation film on the surface of the HSGs.

The present inventor has found, during a research for overcoming the problem of hardly elevating a doping amount as desired in the attempted process, that the doping efficiency is low due to a spontaneous oxidation film existing on the surface of the HSGs of the bottom electrode as shown in FIG. 5.

The present inventor has also found that the spontaneous oxidation film is formed in accordance with the following process.

The spontaneous oxidation film is formed by a reaction between the HSGs and oxygen or water which may exist during a waiting time in a stage between the conveyance of the bottom electrode having the HSGs and a start of the doping. The spontaneous oxidation film is also formed by oxygen or water remaining in the furnace, after the formation of the HSGs of the bottom electrode, during subsequent stages, beginning from a cleansing treatment with ammonia water, a mixed liquid consisting of hydrogen peroxide and sulfuric acid and a mixed liquid consisting of hydrogen peroxide and hydrochloric acid, to the start of the doping after the conveyance to the furnace. Thus, the degree of the oxidation film formation depends on the waiting time and the amount of the remaining oxygen.

If the waiting time is smaller and there is substantially no residual oxygen, a specified amount of the dopant can be secured because no spontaneous oxidation film is formed. However, a longer waiting time or a significant amount of residual oxygen forms the oxidation film and the specified amount of the dopant can not be secured. In this manner, the doping amount is largely varies depending on the state of the treatment process and the desired capacitance cannot be obtained.

As a result, the scattering of the doping amount is a main factor of decreasing a yield of manufacturing the semiconductor device having the capacitive element.

In order to overcome this disadvantage, a large-size capacitive element may be employed not to decrease a yield even though a doping amount somewhat varies. However, the cost of the semiconductor device increases because the large-size capacitive element increases a chip area.

SUMMARY OF THE INVENTION

In view of the foregoing, an object of the present invention is to provide a capacitive element having a large electrostatic capacitance which can be manufactured by stably injecting a dopant at a high concentration into HSGs of a first bottom) electrode without reducing a size of the HSGs and independent of the treatment conducted.

The present invention provides a method for forming a capacitive element on a semiconductor substrate comprising the steps of: forming a bottom electrode having a hemispherical grains (HSGs), said bottom electrode forming step includes consecutively treating an amorphous silicon film by using a HSG treatment to form HSGs, treating surfaces of said HSGs by a oxidation blocking treatment, and introducing impurities into the HSGs; and forming consecutively a dielectric film and a top electrode on said bottom electrode.

In accordance with the present invention, a dopant can be injected into the HSGs at a high concentration because doping is conducted under a state substantially no spontaneous oxidation film is formed on the surface of the HSGs.

Further, since the doping treatment can be conducted at a relatively low thermal treatment temperature by applying the method of the present invention, substantially no adverse effect due to the thermal treatment is exerted on a circuit such as a transistor coexisting with the capacitive element, and reduction of the HSG size can be avoided. Accordingly, the minute capacitive element having a large electrostatic capacitance and an excellent C-V characteristic can be formed which includes the HSGs having a rigid narrow base.

The above and other objects, features and advantages of the present invention will be more apparent from the following description.

PREFERRED EMBODIMENTS OF THE INVENTION

At first, a method for forming a capacitive element in accordance with the present invention will be briefly described.

In the method, a surface of a lower (first) electrode is treated to make HSGs thereon during formation of a capacitive element including the first electrode, a dielectric film and an upper (second) electrode composed of silicon films on a semiconductor substrate. A thermal treatment is conducted to the bottom electrode, which has been subjected to removal of a spontaneous oxidation film and a hydrogen termination treatment for silicon, in a furnace at a temperature between 600 and 800° C. having an ambient of a dopant gas such as $AsH_3$ or $PH_3$ which is not reacted with silicon HSG surfaces subjected to the hydrogen termination treatment prevents spontaneous oxidation during storage of a wafer and oxidation during conveyance into a furnace at a higher temperature in which oxygen may remain. Further, reduction of the capacitance due to the depletion of dopants can be suppressed because the size of the HSGs is not decreased and the dopant gas can be stably supplied at a higher concentration regardless of the treatment conducted. The hydrogen termination treatment may be replaced by an oxygen blocking treatment having a function of preventing formation of a bond between oxygen or water vapor and silicon.

Figure 6:
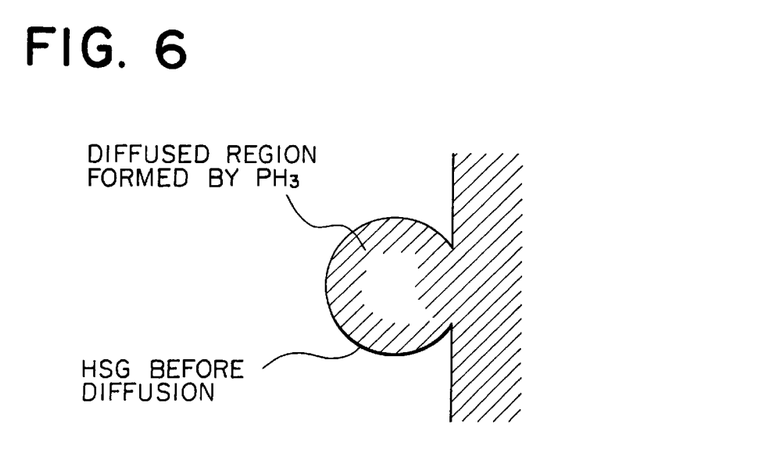
FIG. 6 is a schematic vertical sectional view showing HSGs doped in accordance with a $PH_3$ gas phase diffusion process.

An effect of applying the method for manufacturing the capacitive element in accordance with the present invention will be briefly described referring to FIG. 6 which shows HSGs doped in accordance with a $PH_3$ gas phase diffusion process.

As shown in FIG. 6, even after the thermal treatment, a size of HSGs can be maintained substantially the same as that before the thermal treatment, and phosphorus can be injected at a higher concentration at least in the neighborhood of the surface of the HSGs to extinguish also a depleted region at the center of the HSGs depending on the injection conditions of the dopant.

Now, the present invention is more specifically described with reference to accompanying drawings.

Embodiment 1

Figure 7A:
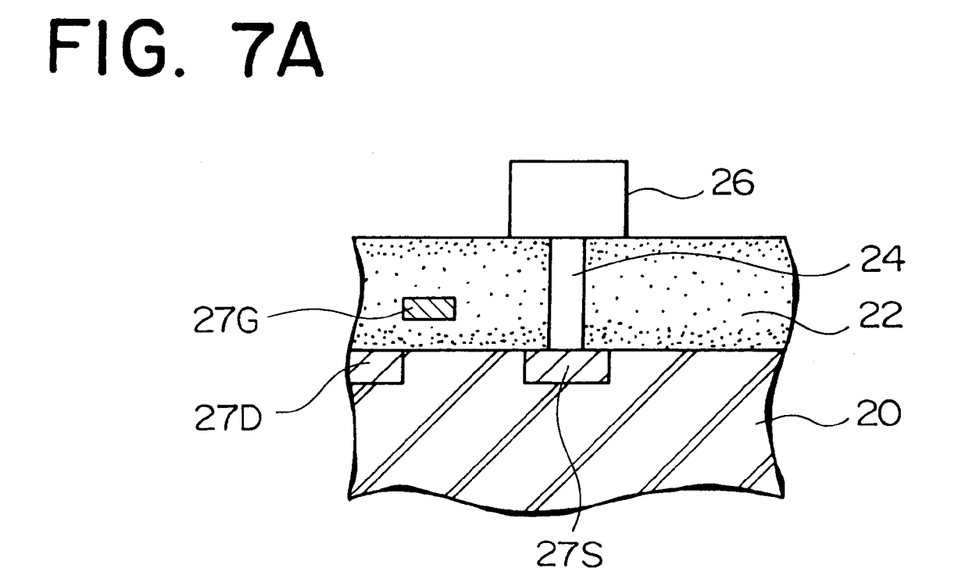
FIGS. 7A and 7B are schematic vertical sectional views sequentially showing the respective steps of forming a capacitive element in accordance with an embodiment of the present invention.

At first, a field is divided by forming an element separation region on a silicon substrate 20, and a transistor including a source diffused region 27S, a drain diffused region 27D and a bit line 27G is formed in the field.

Then, as shown in FIG. 7A, an interlayer dielectric layer 22 made of $SiO_2$ is formed on the transistor (not shown) formed on the substrate 20. A via hole is formed which penetrates the interlayer dielectric layer 22 to reach to the source/drain diffused regions. The via hole is filled with a conductive material to form a plug 24. A phosphorus (P) doped amorphous silicon ($SiO_2$) layer having a phosphorus concentration of $1 \times 10^{20}$ $cm^{-3}$ is grown on the interlayer dielectric layer 22 followed by patterning to form a bottom electrode 26 on the plug 24.

Figure 7B:
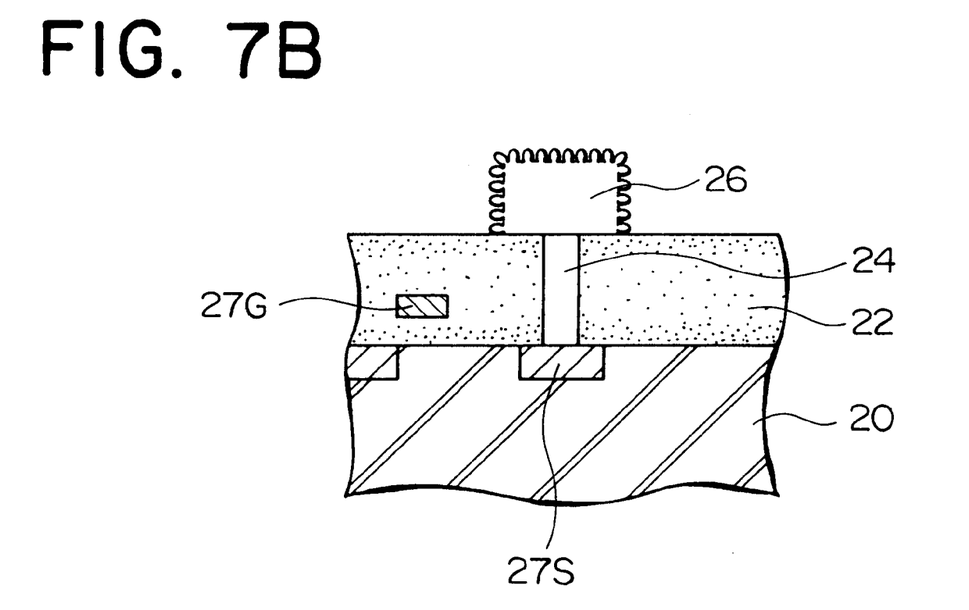

After a spontaneous oxidation film (not shown) formed on the bottom electrode 26 is removed, the surface of the bottom electrode 26 is treated to have HSGs thereon as shown in FIG. 7B in accordance with known treatment conditions. For example, after amorphous silicon is irradiated with silane or disilane for about 30 minutes in a furnace to form silicon nuclei, the amorphous silicon is annealed under vacuum at a temperature between 550 and 700° C. for about 30 minutes to form the HSGs on the amorphous silicon.

Then, a step of hydrogen termination treatment is conducted.

Figure 8A:
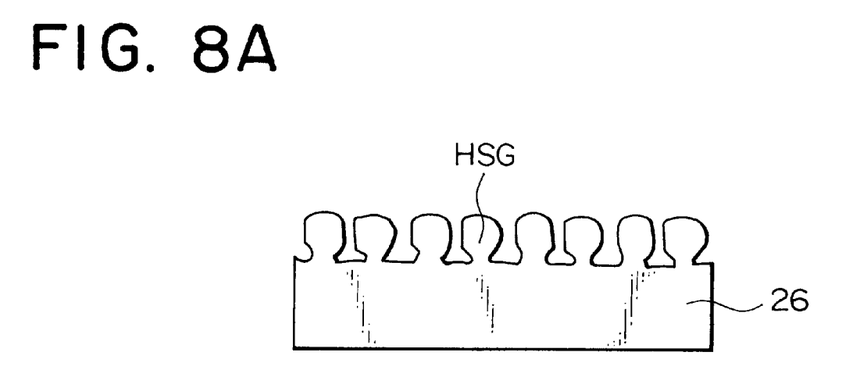
FIGS. 8A, 8B and 8C are schematic views showing the surface of HSGs before formation of a spontaneous oxidation film, the surface of the HSGs after the formation of the spontaneous oxidation film, and the surface of the HSGs after a hydrogen termination treatment, respectively.
Figure 8B:
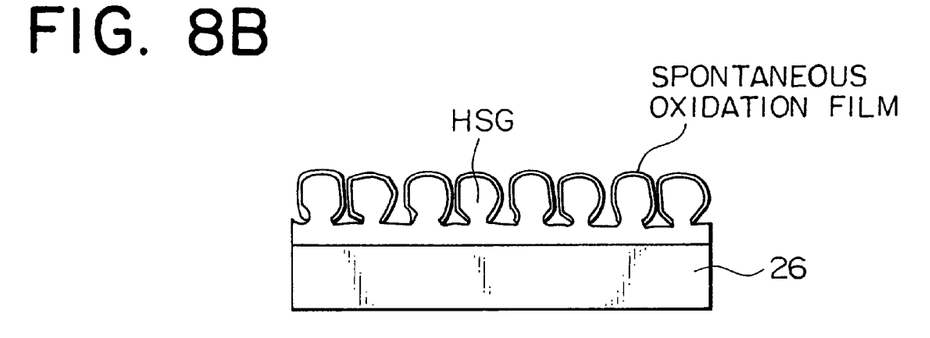

Although the spontaneous oxidation film is not formed on the bottom electrode 26 after the formation of the HSGs in an apparatus for forming HSGs (not shown), another spontaneous oxidation film is formed on the HSGs of the bottom electrode 26 as shown in FIG. 8B after the bottom electrode 26 is taken out from the apparatus and in contact with an ambient. An organic compound formerly existing in the ambient is deposited on the HSG surface.

As a pretreatment, the bottom electrode having the HSGs is cleansed with a cleansing liquid, for example, a mixed liquid containing hydrochloric acid (HCl) and hydrogen peroxide ($H_2O_2$) or a mixed liquid containing sulfuric acid ($H_2SO_4$) and hydrogen peroxide ($H_2O_2$) to remove the organic compound on the spontaneous oxidation film deposited on the surface of the HSGs of the bottom electrode 26.

Figure 8C:
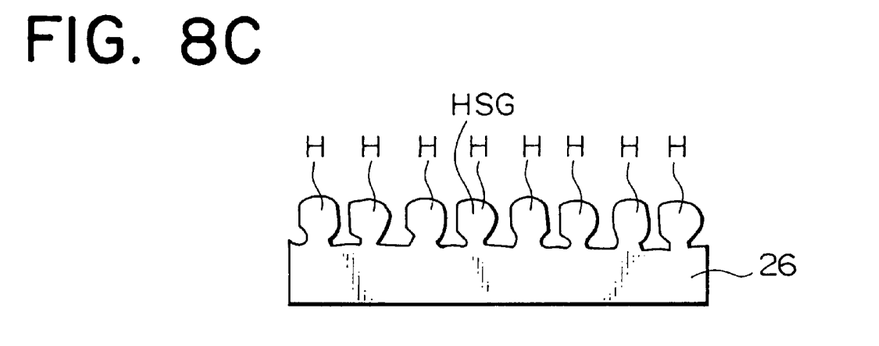

The wafer having the bottom electrode 26 is then dipped in a vessel (not shown) accommodating diluted hydrofluoric acid and the surface of the bottom electrode having the HSGs is treated with the diluted hydrofluoric acid for cleansing in accordance with the following conditions to form hydrogen terminals on the silicon atoms on the surface of the HSGs as shown in FIG. 8C.

Conditions for Hydrogen Termination Treatment

Concentration of diluted hydrofluoric acid: 0.2 to 2.0% in weight

Temperature of diluted hydrofluoric acid: 10 to 40° C.

Treatment Time: 10 to 120 seconds

Then, a step of doping with $PH_3$ is conducted.

Figure 9A:
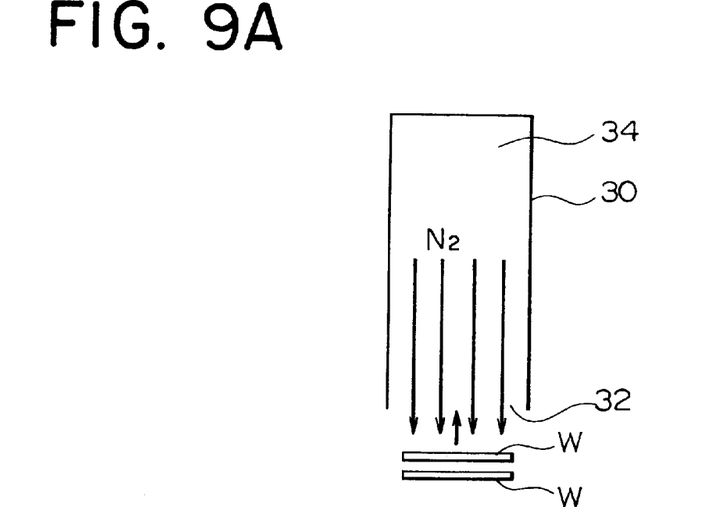
FIGS. 9A to 9C are schematic vertical sectional views sequentially showing the respective steps of doping with $PH_3$.

In this step, a known batch-type vertical reduced pressure thermal treatment furnace shown in FIG. 9A may be employed as a thermal treatment furnace 30 including a substrate inlet 32 and an equipment for supplying a nitrogen gas into the furnace, for example, from an upper portion 34 of the furnace opposite to the substrate inlet 32.

At first, the nitrogen gas is supplied into the furnace from the upper portion 34 thereof, which is then flown out of the furnace from the substrate inlet 32, and a temperature in the furnace, at least that of a nitrogen ambient near the substrate inlet 32, is maintained to be 450° C. or less, for example, 200° C. A plurality of the wafers "W" having the bottom electrode are conveyed into the furnace 30 as shown in FIG. 9A while the conditions of the furnace 30 are maintained.

A position of introducing the nitrogen gas is not restricted to the upper potion 34 of the furnace, and the nitrogen gas may be supplied through the substrate inlet 32. An inert gas other than the nitrogen gas can be employed which is not reacted with the silicon and can expel oxygen and water vapor in the furnace to outside thereof.

Figure 9B:
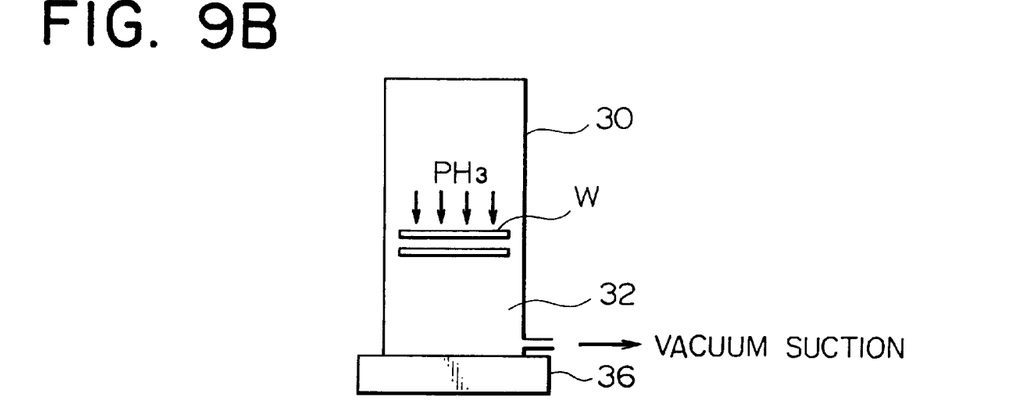

After the wafers "W" are conveyed into the furnace, the substrate inlet 32 is blocked with a gate 36. After the furnace 30 is evacuated by means of vacuum suction to make the inner pressure thereof to 1 mTorr, the inner temperature of the furnace is elevated to a specified temperature for thermal treatment in accordance with the following conditions while $PH_3$ is introduced as a dopant gas as shown in FIG. 9B to inject the phosphorus into the HSGs.

Thermal Treatment Conditions

Thermal Treatment Temperature: 620 to 750° C.

Pressure in Furnace: 0.5 to 100 Torr. ($PH_3$ partial pressure: 0.01 to 10 Torr.)

Flow Rate of $PH_3$: 20 to 500 sccm

Treatment Time: 1 to 100 minutes

Figure 9C:
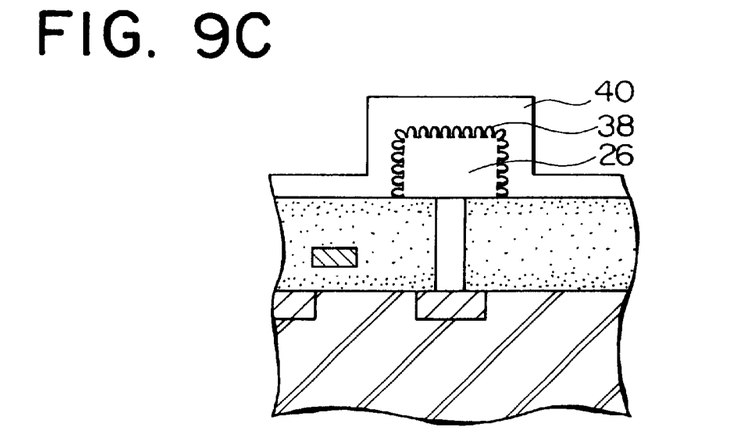

Then, a nitride film such as a $Si_3N_4$ film is formed on the HSGs, which is maintained in an oxidation ambient at a temperature of 750° C. for 30 minutes to convert the surface part of the $Si_3N_4$ film into a $SiO_2$ film to form a composite dielectric film 38 including the $Si_3N_4$ film and the $SiO_2$ film as shown in FIG. 9C. Then, a P-doped amorphous silicon layer is formed thereon and maintained at a temperature of 800° C. for 60 seconds in a nitrogen gas ambient to be crystallized. The crystallized layer is patterned to form a top electrode 40.

A similar result to the C-V characteristic shown in FIG. 2A could be obtained when the characteristic of the capacitive element obtained in Embodiment 1 was measured. It is evident from the present embodiment that the phosphorus can be effectively doped at a temperature lower than the conventional method to form the HSGs having a smaller depleted region.

Embodiment 2

The present embodiment is another example of a method for forming a capacitive element in accordance with the present invention in which $AsH_3$ is employed as a dopant.

Similarly to Embodiment 1, the transistor, the interlayer dielectric layer and the bottom electrode are sequentially formed on the semiconductor substrate, and the bottom electrode is treated to make the HSGs.

As a pretreatment, similarly to Embodiment 1, the bottom electrode having the HSGs is cleansed with a cleansing liquid to remove impurities such as an organic compound deposited on the surface of the HSGs except for the spontaneous oxidation film.

The wafer having the bottom electrode 26 is then dipped in a vessel (not shown) accommodating diluted hydrofluoric acid and the surface of the bottom electrode having the HSGs is treated with the diluted hydrofluoric acid for cleansing in accordance with the following conditions to form hydrogen terminals on the silicon atoms on the surface of the HSGs.

Conditions for Hydrogen Termination Treatment

Concentration of diluted hydrofluoric acid:

0.2 to 2.0% in weight

Temperature of diluted hydrofluoric acid: 10 to 40° C.

Treatment Time: 10 to 120 seconds

Then, a step of doping with $AsH_3$ is conducted.

A method for conveying the wafer into the furnace is similarly conducted to Embodiment 1.

After the wafers "W" are conveyed into the furnace 30, the substrate inlet 32 is blocked with a gate 36. After the furnace 30 is evacuated by means of vacuum suction to make the inner pressure thereof to 1 mTorr, the inner temperature of the furnace is elevated to a specified temperature for thermal treatment while $AsH_3$ is introduced as a dopant gas to inject the As into the HSGs.

Thermal Treatment Conditions

Thermal Treatment Temperature: 600 to 750° C.

Pressure in Furnace: 0.5 to 100 Torr. ($AsH_3$ partial pressure: 0.01 to 10 Torr.)

Flow Rate of $AsH_3$: 20 to 500 sccm

Treatment Time: 1 to 100 minutes

Then, the capacitive element is manufactured similarly to Embodiment 1.

A similar result to the C-V characteristic shown in FIG. 2A could be obtained when the characteristic of the capacitive element obtained in Embodiment 2 was measured, similarly to Embodiment 1. It is evident from the present embodiment that the arsenic (As) can be effectively doped at a temperature lower than those of the conventional method and of the method of Embodiment 1 to form the HSGs having a smaller depleted region.

Modified Examples of Embodiments 1 and 2

In the present modified Examples, a capacitive element is manufactured by means of a hydrogen termination treatment and a thermal treatment similar to those of Embodiments 1 and 2 except that the HSGs are formed under a reduced pressure of $1 \times 10^{-7}$ Torr or less in these examples different from Embodiments 1 and 2.

Similar results to the C-V characteristic shown in FIG. 2A could be obtained when the characteristics of the capacitive elements obtained in these examples were measured. It is evident that the phosphorus or the arsenic can be effectively doped at a temperature lower than the conventional method to form the HSGs having a smaller depleted region even if the method of forming the HSGs of the bottom electrode is different.

Various conditions other than those of Embodiments 1 and 2 can be applied as those for the thermal treatment step.

As another modified example of Embodiments 1 and 2, capacitive elements were manufactured at various thermal treatment temperatures between 600 and 800° C., and C-V characteristics of the capacitive elements were measured to obtain similar results to the C-V characteristic shown in FIG. 2A.

It is evident that as far as the thermal treatment temperature is in a range specified in the present invention, the phosphorus or the arsenic can be effectively doped at a temperature lower than the conventional method to form the HSGs having a smaller depleted region.

A reason of maintaining the temperature of the furnace below 450° C. is that if the wafer is in contact with an ambient having a temperature of 450° C. or more, hydrogen bonded to the silicon on the surface of the HSGs by means of the hydrogen termination treatment may be eliminated and the HSG surface after the hydrogen elimination may be oxidized to form a spontaneous oxidation film. However, a temperature slightly below 450° C. is desirable because a long period of time is required for elevating the furnace temperature in the later step if the temperature is too low.

A reason of conveying the wafer to the furnace while the wafer is maintained in the inert gas ambient such as the nitrogen ambient is that a substance such as oxygen and water is expelled form the furnace and is not in contact with the wafer. If such the substance exists in the furnace, the substance reacts with the hydrogen eliminated in the furnace to form a reaction product which may be deposited on the HSG surface to lower a doping effect.

Since the above embodiments are described only for examples, the present invention is not limited to the above embodiments and various modifications or alternations can be easily made therefrom by those skilled in the art without departing from the scope of the present invention.

What is claimed is:

1. A method for forming a capacitive element on a semiconductor substrate comprising the steps of:

forming a bottom electrode having a hemispherical grains (HSGs), said bottom electrode forming step includes consecutively treating an amorphous silicon film by using a HSG treatment to form HSGs;

treating surfaces of said HSGs by at least an oxidation blocking treatment, and introducing a high level of impurities into the HSGs at a temperature of between 600 to 800 deg C.; and forming consecutively a dielectric film and a top electrode on said bottom electrode.

2. The method as defied in claim 1, wherein said oxidation blocking treatment comprises a hydrogen termination treatment conducted by exposing the wafer to diluted hydrofluoric acid.

3. A method for forming a capacitive element including a first electrode, a dielectric film and a second electrode composed of silicon films overlying a semiconductor substrate, comprising the steps of:

forming hemispherical grains (HSGs) on the surface of said first electrode;

conducting a hydrogen termination treatment on silicon atoms existing on the surface of the HSGs of said first electrode;

keeping the wafer in an inert gas ambient in a thermal treatment furnace and keeping temperatures of a furnace wafer inlet area and near the inlet area of the thermal treatment furnace below 450° C.;

conveying the wafer after said hydrogen termination treatment which is maintained in an inert gas ambient into the furnace; and thermally treating said first electrode at a temperature between 600 and 800° C. in an ambient having a dopant gas which does not react with silicon in the furnace.

4. The method as defined in claim 3, wherein the wafer is exposed to diluted hydrofluoric acid to conduct said hydrogen termination treatment on silicon atoms.

5. The method as defined in claim 3, wherein said hydrogen termination treatment is conducted on the wafer at a temperature of 100° C. or less in an oxygen containing ambient or an oxygen free ambient, and the wafer is maintained in the inert gas ambient while being conveyed into the furnace.

6. The method as defined in claim 3, wherein an inert gas flows from the furnace, and the wafer after said hydrogen termination treatment is conveyed into the furnace through the inert gas flow.

7. The method as defined in claim 3, wherein after the interior of the furnace is pumped to a specified vacuum pressure upon conveyance of the wafer, followed by the introduction of the dopant gas, the temperature of the furnace is elevated to between 600 and 800° C.

8. The method as defined in claim 3, wherein a batch-type vertical reduced pressure thermal treatment furnace is employed as the thermal treatment furnace.

9. The method as defined in claim 8, wherein the furnace has a load lock chamber maintained in an inert gas ambient at a temperature of 450° C. or less, and after the wafer being subjected to said hydrogen termination treatment is transferred to the load lock chamber evacuated or filled with the inert gas, the wafer is conveyed from the load lock chamber to the furnace having the ambient of the dopant gas which does not react with silicon followed by said thermal treatment at the temperature between 600 and 800° C.

10. The method as defined in claim 3, wherein the dopant gas is $AsH_3$ or $PH_3$.

* * * * *